(12) United States Patent
Omura et al.

(10) Patent No.: US 8,300,857 B2
(45) Date of Patent: Oct. 30, 2012

(54) ACOUSTIC SENSOR

(75) Inventors: Eiichi Omura, Nara (JP); Naoshi Ozawa, Otsu (JP); Shuichi Wakabayashi, Kizugawa (JP)

(73) Assignee: OMRON Corporation, Kyoto (JP)

( * ) Notice: Subject to any disclaimer, the term of this patent is extended or adjusted under 35 U.S.C. 154(b) by 149 days.

(21) Appl. No.: 13/016,436

(22) Filed: Jan. 28, 2011

(65) Prior Publication Data

US 2011/0204745 A1 Aug. 25, 2011

(30) Foreign Application Priority Data

Feb. 24, 2010 (JP) .................................. 2010-038289

(51) Int. Cl.
 *H04R 25/00* (2006.01)
(52) U.S. Cl. ........................ 381/174; 381/191; 381/369
(58) Field of Classification Search ................. 381/369, 381/173–176, 178, 190–191, 355, 360–361
See application file for complete search history.

(56) References Cited

U.S. PATENT DOCUMENTS

| 7,221,767 | B2 * | 5/2007 | Mullenborn et al. | ......... 381/174 |
| 7,974,430 | B2 * | 7/2011 | Izuchi et al. | .................. 381/369 |
| 8,155,355 | B2 * | 4/2012 | Ogura et al. | .................. 381/174 |
| 2007/0261910 | A1 | 11/2007 | Kasai et al. | |
| 2008/0075309 | A1 | 3/2008 | Chen et al. | |
| 2008/0247587 | A1 | 10/2008 | Sato | |
| 2009/0181489 | A1 | 7/2009 | Horimoto et al. | |
| 2010/0219536 | A1 | 9/2010 | Kazama et al. | |

FOREIGN PATENT DOCUMENTS

| EP | 2252077 A1 | 11/2010 |
| JP | 2007295487 A | 11/2007 |
| JP | 2008-510427 T | 4/2008 |
| JP | 2008278476 A | 11/2008 |
| JP | 2009246779 A | 10/2009 |
| WO | 2006/023016 A1 | 3/2006 |
| WO | 2009051183 A1 | 4/2009 |

OTHER PUBLICATIONS

Japanese Office Action Issued in Japanese Application No. 2010-038289, Dated Nov. 1, 2011 (8 Pages with Enlgish Translation).
Extended European Search Report for Application No. 10196842.8, mailed on Feb. 24, 2012 (9 pages).
Bergqvist J et al., "A Silicon Condenser Mircophone with a Highly Perforated Backplate", Transducers. San Francisco, Jun. 24-27, 1991.

* cited by examiner

*Primary Examiner* — Suhan Ni
(74) *Attorney, Agent, or Firm* — Osha Liang LLP

(57) ABSTRACT

An acoustic sensing element has a substrate that includes a back chamber, a vibration electrode plate that is provided in a surface of the substrate while being opposite an upper surface opening of the back chamber, and a fixed electrode plate that is provided opposite the vibration electrode plate, an acoustic hole being made in the fixed electrode plate. The acoustic sensing element outputs an electric signal based on an electrostatic capacitance change generated between the vibration electrode plate and the fixed electrode plate by a displacement of the vibration electrode plate. A lower surface of the back chamber is closed into a pouched shape by the substrate.

5 Claims, 16 Drawing Sheets

ACOUSTIC SENSOR

BACKGROUND OF THE INVENTION

1. Technical Field

One or more embodiments of the present invention relate to an acoustic sensing element (MEMS micro chip) that is prepared by utilizing a MEMS technology and an acoustic sensor provided with the acoustic sensing element.

2. Related Art

FIG. 1A is a sectional view illustrating a structure of a conventional acoustic sensor, FIG. 1B is a schematic plan view illustrating a state in which a cover of the acoustic sensor is removed, and FIG. 1C is a plan view illustrating a state in which the cover of the acoustic sensor is attached. In an acoustic sensor 11, an acoustic sensing element 14 and a processing circuit unit 15 (IC chip) are accommodated in a casing including a base substrate 12 and a cover 13, a lower surface of the acoustic sensing element 14 is bonded to an upper surface of the base substrate 12 by a thermosetting bonding agent 24, and the processing circuit unit 15 is fixed by a bonding agent. The acoustic sensing element 14 includes a silicon substrate 16 in which a vertically-piercing back chamber 17 is formed, and a thin-film vibration electrode plate 18 is disposed opposite an upper surface opening of the back chamber 17 in an upper surface of the silicon substrate 16 and is covered with a fixed electrode plate 19 that is provided opposite the vibration electrode plate 18. In the vibration electrode plate 18, four corners are supported by leg portions 20, and a portion except the four corners is supported in the air by the upper surface of the silicon substrate 16. An opening 21 is formed in the cover 13 in order to guide an acoustic vibration into the casing, and a plurality of acoustic holes 22 are made in the fixed electrode plate 19 in order to guide the acoustic vibration to the vibration electrode plate 18. The acoustic vibration is converted into an electric signal and outputted based on an electrostatic capacitance change between the vibration electrode plate 18 and the fixed electrode plate 19. The vibration electrode plate 18 vibrates by resonating with the acoustic vibration, thereby generating the electrostatic capacitance change (for example, see International Patent Publication No. 2008-510427).

(Run-Up of Bonding Agent)

However, in the acoustic sensor 11, because the lower surface of the silicon substrate 16 having the vertically-piercing back chamber 17 is bonded to the upper surface of the base substrate 12 by the thermosetting bonding agent 24, the bonding agent 24 that is in the fluidized state immediately after application runs up the wall surface of the back chamber 17 by a surface tension to easily reach the upper surface of the silicon substrate 16. Particularly, in the case of the back chamber 17 having a prismatic shape or a truncated-pyramid shape, the bonding agent 24 easily runs up to the upper surface of the silicon substrate 16 along a valley line (that is, an angular portion between sidewall surfaces of the back chamber 17). When the bonding agent 24 runs up to the upper surface of the silicon substrate 16, the bonding agent 24 invades into a gap (vent hole 23) between the upper surface of the silicon substrate 16 and the lower surface in an edge portion of the vibration electrode plate 18, and a part of the vibration electrode plate 18, which should originally be floated from the silicon substrate 16, is stuck to the silicon substrate 16 to suppress the vibration of the vibration electrode plate 18. When the vibration electrode plate 18 and the silicon substrate 16 are stuck by the run-up of the bonding agent 24, a distance between the fixed electrode plate 19 and the vibration electrode plate 18 is widened to decrease the electrostatic capacitance value, which causes sensitivity degradation of the acoustic sensor 11 or a characteristic change. When the run-up of the bonding agent 24 is prevented, a range of options of the bonding agent 24 is narrowed and cost is increased.

(Silicon Substrate Deformation Due to Heat and External Force)

In the acoustic sensor 11 having the above-described structure, according to one or more embodiments of the present invention, the base substrate 12 is made of a hard material such as ceramic whose linear expansion coefficient is substantially equal to that of the silicon substrate 16. However, the ceramic substrate is expensive, and the cost of the acoustic sensor 11 is increased. Therefore, an organic substrate such as a resin substrate and a resin multi-layer substrate is generally used.

Because the organic substrate significantly differs from the silicon substrate 16 of the acoustic sensing element 14 in the linear expansion coefficient, a thermal stress is generated between the silicon substrate 16 and the base substrate 12 by heat generation of the processing circuit unit 15 or external heat, which generates a risk of a warpage in the silicon substrate 16 and the base substrate 12. Therefore, a soft (low Young's modulus) bonding agent is used as the bonding agent 24 that bonds the lower surface of the silicon substrate 16 to the base substrate 12, and an internal stress generated between the base substrate 12 and the silicon substrate 16 is relaxed by the soft bonding agent 24.

The bonded portion between the silicon substrate 16 and the base substrate 12 has the flexible structure, and the silicon substrate 16 also has relatively low rigidity because the silicon substrate 16 is vertically pierced by the back chamber 17. Therefore, the silicon substrate 16 is easily deformed when the thermal stress is generated or when the external force is applied.

When the silicon substrate 16 is deformed, the distance between the vibration electrode plate 18 and the fixed electrode plate 19 is decreased to degrade the sensitivity or the characteristic is changed, which results in a possibly that the acoustic sensor 11 cannot be used. Therefore, the gap distance between the vibration electrode plate 18 and the fixed electrode plate 19 cannot extremely be decreased, which causes a restriction in improving the sensitivity of the acoustic sensor 11.

(Brittleness of Vibration Electrode Plate)

When the silicon substrate 16 is deformed, a stress is unevenly generated in the vibration electrode plate 18 to decrease strength of the vibration electrode plate 18. Additionally, in order to sense the weak acoustic vibration with the acoustic sensor, it is necessary to extremely thin the vibration electrode plate 18. Therefore, the vibration electrode plate 18 is considerably brittle, and the vibration electrode plate 18 is easily broken by a drop of the acoustic sensor. Accordingly, in consideration of the strength, the thickness of the vibration electrode plate 18 is hardly decreased than ever before.

(Back Chamber Leakage Due to Bonding Failure)

When the silicon substrate 16 or the base substrate 12 is deformed, possibly the bonding agent 24 is peeled off to generate a bonding failure. Occasionally a gap is generated between the lower surface of the silicon substrate 16 and the base substrate 12 by the bonding failure when the lower surface of the silicon substrate 16 is bonded to the base substrate 12 by the bonding agent 24. When the bonding failure is generated, the acoustic vibration invades from the gap to reduce a difference in sound pressure between a surface and a rear surface of the vibration electrode plate 18, which degrades the sensitivity of the acoustic sensor 11.

SUMMARY

One or more embodiments of the present invention prevents the phenomenon in which the bonding agent that fixes the acoustic sensing element to the base substrate runs up through the back chamber. One or more embodiments of the present invention prevents the leakage of the back chamber from the lower surface of the acoustic sensing element. One or more embodiments of the present invention reduces the deformation of the acoustic sensing element to improve the sensitivity of the acoustic sensor.

In accordance with one aspect of the present invention, there is provided an acoustic sensing element including a substrate that includes a back chamber, a vibration electrode plate that is provided in a surface of the substrate while being opposite an upper surface opening of the back chamber, and a fixed electrode plate that is provided opposite the vibration electrode plate, an acoustic hole being made in the fixed electrode plate, wherein the acoustic sensing element outputs an electric signal based on an electrostatic capacitance change generated between the vibration electrode plate and the fixed electrode plate by a displacement of the vibration electrode plate, the substrate is formed by joining a sub-substrate to a lower surface of a main substrate having a through-hole that pierces the main substrate from a front surface to a rear surface, and a lower surface of the through-hole is closed by the sub-substrate, thereby forming the back chamber by a space including the through-hole, a lower surface of the back chamber being closed into a pouched shape.

In an acoustic sensing element according to one or more embodiments of the present invention, because the lower surface of the back chamber is closed by the sub-substrate, when the lower surface of the acoustic sensing element is bonded to the base substrate by the bonding agent, the bonding agent does not run up the wall surface in the back chamber. Therefore, the vibration electrode plate can be prevented from being stuck to the element substrate by the bonding agent, a vibration characteristic of the vibration electrode plate can be stabilized, and the sensitivity degradation of the acoustic sensor can be prevented while reliability is improved.

Even if the bonding failure of the acoustic sensing element is generated when the acoustic sensing element is bonded to the base substrate, the acoustic vibration does not invade from the lower surface of the back chamber, and the sensitivity degradation of the acoustic sensor is not generated by the leakage of the back chamber. Accordingly, a yield is improved in a sensor producing process.

Because the rigidity of the substrate of the element is improved, an impact resistance of the acoustic sensing element is improved. Particularly, because vibration electrode plate is hardly broken by a drop impact, the vibration electrode plate can be thinned to improve the sensitivity of the acoustic sensing element.

Because the rigidity of the substrate of the element is improved, the acoustic sensing element is hardly deformed by the thermal stress or the external force, and the sensitivity degradation or the characteristic change can be prevented. Therefore, the gap between the vibration electrode plate and the fixed electrode plate can be narrowed to improve the sensitivity of the acoustic sensing element.

Further, in an acoustic sensing element according to one or more embodiments of the present invention, the substrate is formed by joining a sub-substrate to a rear surface of a main substrate having a through-hole that pierces the main substrate from a surface to the rear surface, and a lower surface of the through-hole is closed by the sub-substrate, thereby forming the back chamber by a space including the through-hole. Therefore, the back chamber whose lower surface side is closed can be prepared by simply joining the sub-substrate to the lower surface of the main substrate in which the through-hole is made, which facilitates the producing process.

In an acoustic sensing element according to one or more embodiments of the present invention, a recess may be formed in the sub-substrate while communicated with the through-hole, and the back chamber may be formed by the through-hole and the recess. According to the above aspect, a volume of the back chamber can be formed larger than that of the case where the back chamber is formed only by the through-hole, and the sensitivity of the acoustic sensing element can be improved.

In an acoustic sensing element according to one or more embodiments of the present invention, the main substrate and the sub-substrate are joined by a method in which a bonding agent is not used. Because the substrates are joined with no use of the bonding agent, the bonding agent does not run up the through-hole of the main substrate to adhere to the vibration electrode plate, and therefore the reliability of the acoustic sensing element is enhanced while the yield is improved in the production.

In an acoustic sensing element according to one or more embodiments of the present invention, the main substrate and the sub-substrate are made of materials whose linear expansion coefficients are substantially equal to each other.

According to one or more embodiments of the present invention the warpage is hardly generated between the main substrate and the sub-substrate by a temperature change, the gap between the vibration electrode plate and the fixed electrode plate is hardly changed, and a temperature characteristic of the acoustic sensing element is stabilized. The vibration electrode plate is hardly stuck to the fixed electrode plate by the warpage.

In accordance with one or more embodiments of the present invention, there is provided an acoustic sensor, wherein a lower surface of the acoustic sensing element is stuck to an upper surface of a base substrate by a bonding agent, and a cover is attached to the upper surface of the base substrate such that the acoustic sensing element is covered therewith.

DETAILED DESCRIPTION

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. However, the present invention is not limited to the following embodiments, but various modifications can be made without departing from the scope of the present invention.

First Embodiment

Figure 1A:
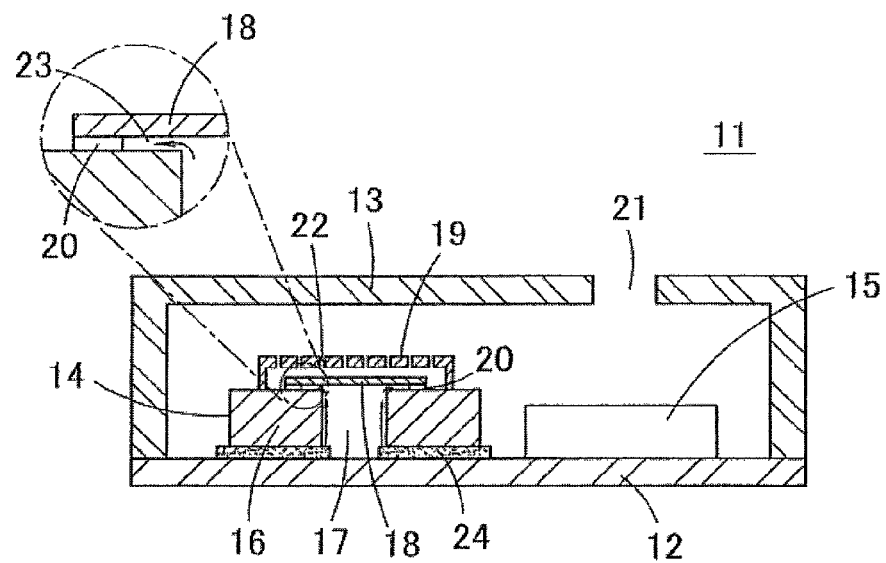
FIG. 1A is a sectional view illustrating a structure of a conventional acoustic sensor.
Figure 1B:
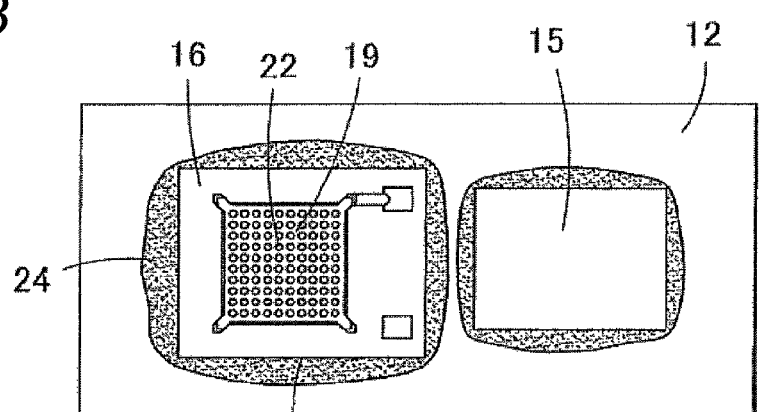
FIG. 1B is a plan view illustrating a state in which a cover of the acoustic sensor is removed.
Figure 1C:
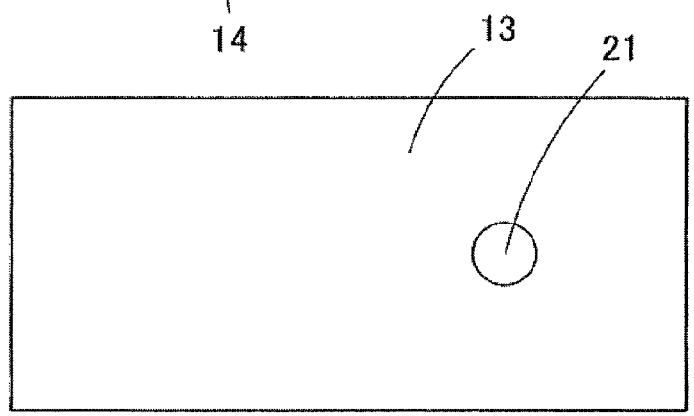
FIG. 1C is a plan view illustrating a state in which the cover of the acoustic sensor is attached.
Figure 2:
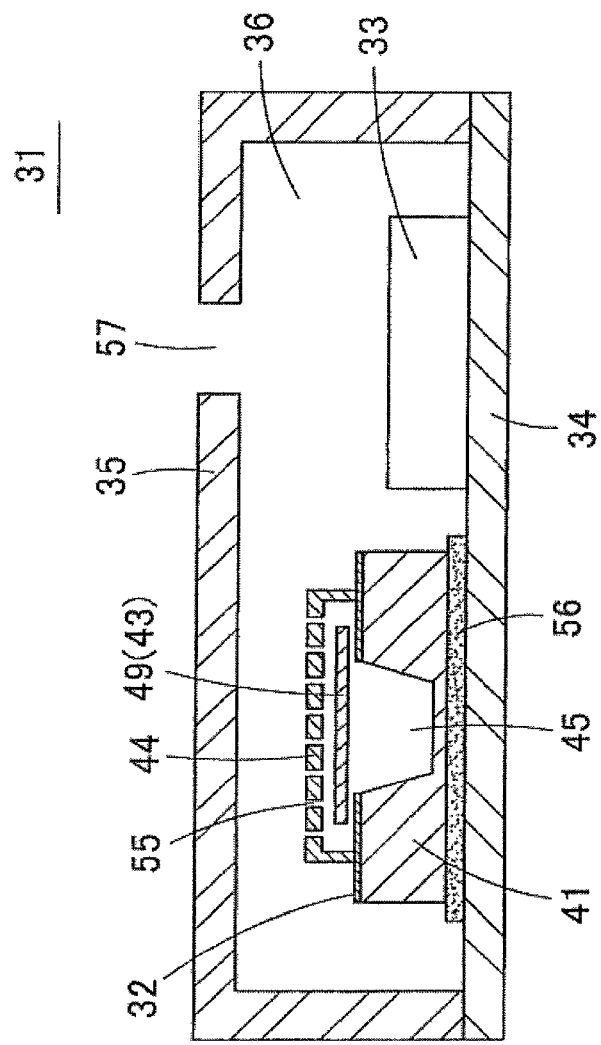
FIG. 2 is a schematic sectional view of an acoustic sensor according to a first embodiment of the present invention.

An acoustic sensor 31 according to a first embodiment of the present invention will be described below with reference to FIGS. 2 and 3. FIG. 2 is a schematic sectional view of the acoustic sensor 31. The acoustic sensor 31 mainly includes an acoustic sensing element 32 and a circuit element 33 (IC chip). Lower surfaces of the acoustic sensing element 32 and circuit element 33 are bonded to an upper surface of a base substrate 34, in which a wiring pattern is formed, by a thermosetting bonding agent (thermosetting resin bonding agent). The acoustic sensing element 32 and the circuit element 33 are covered with an electromagnetic shielding cover 35 joined to the upper surface of the base substrate 34, and the acoustic sensing element 32 and the circuit element 33 are accommodated in a space 36 that is formed by the base substrate 34 and the cover 35.

Figure 3:
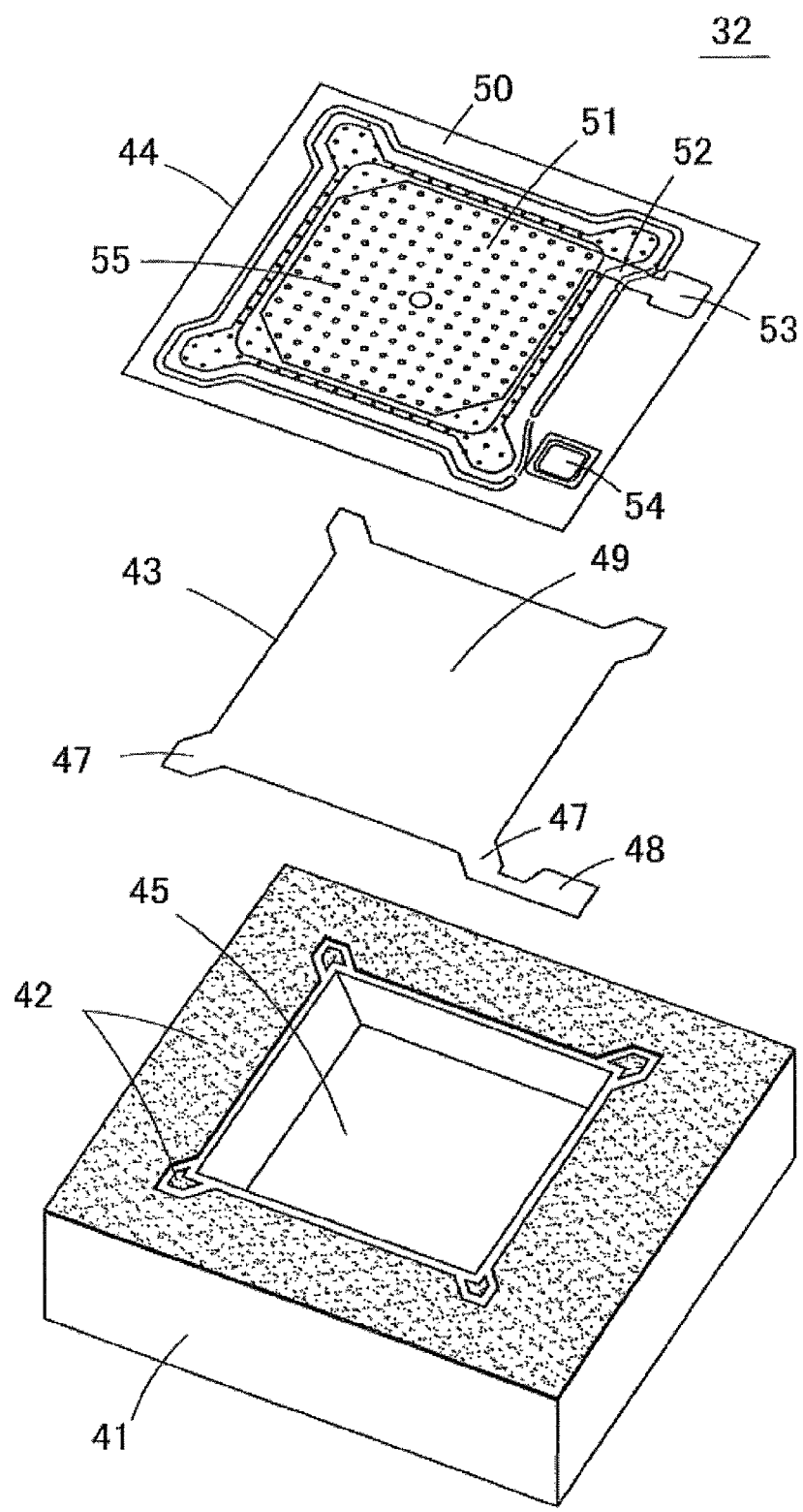
FIG. 3 is an exploded perspective view of an acoustic sensing element used in the acoustic sensor of the first embodiment.

FIG. 3 is an exploded perspective view illustrating a structure of the acoustic sensing element 32. The acoustic sensing element 32 is a micro electrostatic capacitance type element (MEMS transducer) that is prepared by utilizing the MEMS (Micro Electro Mechanical Systems) technology. In the acoustic sensing element 32, a vibration electrode plate 43 is provided in an upper surface of an element substrate 41 that is of a silicon substrate with an insulating film 42 interposed therebetween, and a fixed electrode plate 44 is provided on the vibration electrode plate 43 with a microgap (void) interposed therebetween.

As illustrated in FIGS. 2 and 3, the element substrate 41 includes a back chamber 45 that is recessed from a surface toward a rear surface by wet etching. The back chamber 45 does not reach the lower surface of the element substrate 41, and the back chamber 45 is opened only in the upper surface of the element substrate 41 while closed into a pouched shape in the lower surface of the element substrate 41. An inner peripheral surface of the back chamber 45 may vertically be formed or tapered. As to dimensions of the element substrate 41, the element substrate 41 is formed into a square of about 1 to about 1.5 mm (or less) when viewed from above, and a thickness ranges from about 400 to about 500 μm. An insulating film 42 made of an oxide film ($SiO_2$ film) is formed by the upper surface of the element substrate 41.

The vibration electrode plate 43 is formed by a polysilicon thin film having a thickness of about 1 μm. The vibration electrode plate 43 is a thin film having a substantially rectangular shape, and support legs 47 are diagonally extended toward the outside in four corner portions of the vibration electrode plate 43. An extended portion 48 is extended from one of the support legs 47. The vibration electrode plate 43 is disposed in the upper surface of the element substrate 41 such that the upper surface of the back chamber 45 is covered therewith, and the support legs 47 in the four corners and the extended portion 48 are fixed onto the insulating film 42. In the vibration electrode plate 43, a portion (in the first embodiment, a portion except the support legs 47 and the extended portion 48) that is supported in the air above the back chamber 45 constitutes a diaphragm 49 (vibration film), and the diaphragm 49 vibrates according to an acoustic vibration (air vibration).

In the fixed electrode plate 44, a fixed electrode 51 made of a metallic thin film is provided in an upper surface of a back plate 50 made of a nitride film. In a region where the fixed electrode plate 44 is disposed opposite the diaphragm 49, the diaphragm 49 is covered with the fixed electrode plate 44 with a micro gap of about 3 μm, and the fixed electrode 51 is disposed opposite the diaphragm 49 to constitute a capacitor. An outer peripheral portion of the fixed electrode plate 44, that is, an outside portion of a region that is opposite the diaphragm 49 is fixed to the upper surface of the element substrate 41 while the insulating film 42 made of an oxide film is interposed therebetween.

A lead-out portion 52 is extended from the fixed electrode 51, and an electrode pad 53 (Au film) that is electrically conducted to the fixed electrode 51 is provided at a leading end of the lead-out portion 52. An electrode pad 54 (Au film) is provided in the fixed electrode plate 44. The electrode pad 54 is joined to the extended portion 48 of the vibration electrode plate 43 to electrically conduct the extended portion 48 to the vibration electrode plate 43. The electrode pad 53 is disposed in the upper surface of the back plate 50, and the electrode pad 54 is joined to the extended portion 48 through an opening of the back plate 50.

In order to pass the acoustic vibration, many acoustic holes 55 are made in the fixed electrode 51 and the back plate 50 so as to be pierced from the upper surface to the lower surface. Because the vibration electrode plate 43 resonates with the acoustic vibration or the mechanical vibration to vibrate, the vibration electrode plate 43 is made of a thin film having a thickness of about 1 μm. On the other hand, because the fixed electrode plate 44 is the electrode that is not excited by the acoustic vibration or the mechanical vibration, the fixed electrode plate 44 has a thickness of 2 μm or more.

The whole rear surface of the acoustic sensing element 32 is jointed to the upper surface of the base substrate 34 by a bonding agent 56 made of a thermosetting resin. The circuit element 33 that processes an output signal of the acoustic sensing element 32 is also bonded to the upper surface of the base substrate 34 by a thermosetting resin. The acoustic sensing element 32 and the circuit element 33 are connected through wiring pattern of the base substrate 34 by a bonding wire.

The cover 35 has an electromagnetic shielding function of cutting off an electromagnetic noise from the outside. Therefore, the cover 35 may be made of a conductive metal, or an inner surface of a resin cover may be covered with a metallic film by plating. An opening 57 is formed in the cover 35, and the space 36 between the opening 57 and the acoustic hole 55 constitutes a pathway through which the acoustic vibration propagates. In the base substrate 34, a part of a grounding wiring pattern also has the electromagnetic shielding function.

In the acoustic sensor 31, the acoustic vibration propagates into the space 36 through the opening 57 of the cover 35 and propagates into the acoustic sensing element 32 through the acoustic hole 55, whereby the diaphragm 49 vibrates by the acoustic vibration. When the diaphragm 49 vibrates, a gap distance between the diaphragm 49 and the fixed electrode plate 44 is changed, and therefore an electrostatic capacitance between the diaphragm 49 and the fixed electrode 51 is changed. Accordingly, when the change in electrostatic capacitance is extracted as an electric signal while a DC voltage is applied between the electrode pads 53 and 54, the acoustic vibration can be detected by converting the acoustic vibration into the electric signal.

In the acoustic sensor 31, because the lower surface of the back chamber 45 is closed by the element substrate 41, when the lower surface of the acoustic sensing element 32 is bonded to the base substrate 34 by the bonding agent 56 made of the thermosetting resin, the bonding agent 56 that is in the fluidized state before the curing does not run up the wall surface of the back chamber 45 by the surface tension. As a result, that the bonding agent 56 invades into the gap (vent hole) between the upper surface of the element substrate 41 and the vibration electrode plate 43 to stick the vibration electrode plate 43 to the element substrate 41 is eliminated unlike the conventional technology. Therefore, according to the acoustic sensor 31, the sticking of the vibration electrode plate 43 to the element substrate 41 can be prevented to stabilize the vibration characteristic of the diaphragm 49, and the reliability can be improved while the sensitivity degradation of the acoustic sensor 31 is prevented. The bonding agent 56 does not run up the back chamber 45, so that the range of options of the bonding agent 24 can be broadened to reduce the cost of the acoustic sensor 31.

Because the lower surface of the back chamber 45 is closed, even if the bonding failure exists in bonding the acoustic sensing element 32 to the base substrate 34, the acoustic vibration does not invade from the lower surface of the acoustic sensing element 32 by the leakage of the back chamber 45. Therefore, the sensitivity degradation of the acoustic sensor 31 due to the leakage can be prevented to improve the yield in the sensor producing process.

Because the element substrate 41 is not pierced vertically by the opening (back chamber 45), the rigidity of the element substrate 41 is increased compared with the element substrate in the conventional acoustic sensor. Therefore, the vibration electrode plate 43 can be supported by the element substrate 41 having the high rigidity, the impact resistance of the acoustic sensing element 32 is improved, and the acoustic sensing element 32 and the vibration electrode plate 43 is hardly broken by the drop impact.

Because the rigidity of the element substrate 41 is increased, the acoustic sensing element 32 is hardly deformed even if the thermal stress is generated or the external force is applied. Therefore, the gap between the vibration electrode plate 43 and the fixed electrode plate 44 is hardly changed, so that the sensitivity degradation of the acoustic sensor 31 and the characteristic change can be prevented.

As a result, the diaphragm 49 can be thinned, the gap between the vibration electrode plate 43 and the fixed electrode plate 44 can be narrowed, and the sensitivity of the acoustic sensor 31 can be improved.

Second Embodiment

Figure 4:
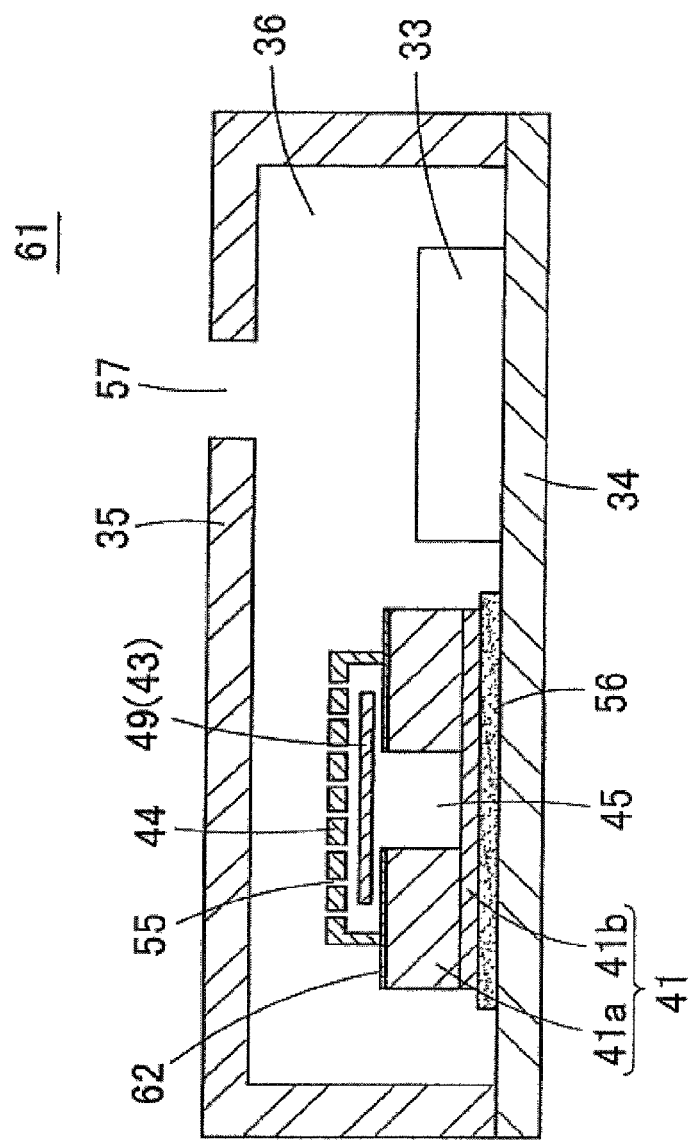
FIG. 4 is a schematic sectional view of an acoustic sensor according to a second embodiment of the present invention.
Figure 5:
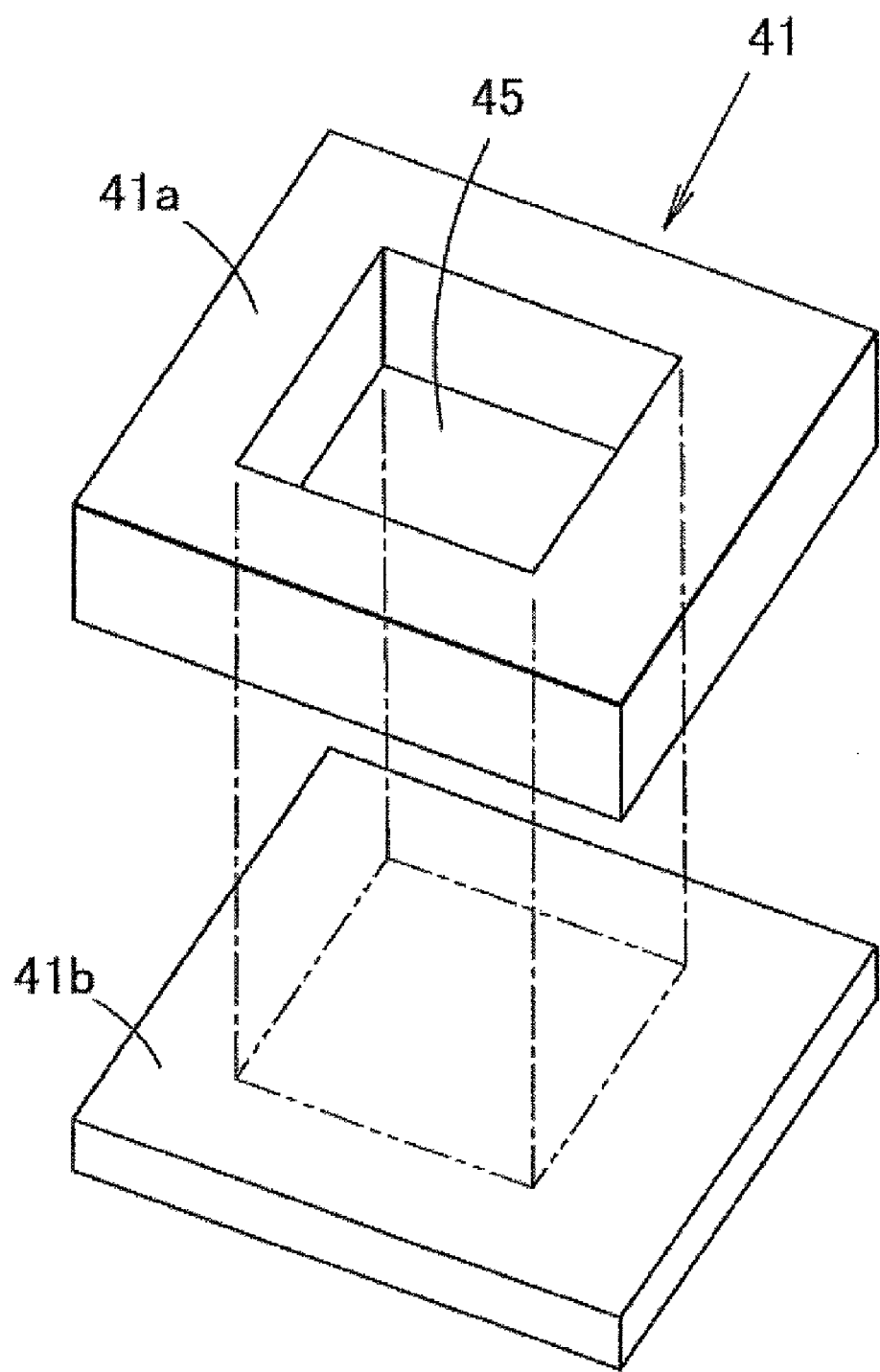
FIG. 5 is an exploded perspective view illustrating an element substrate of an acoustic sensing element used in the acoustic sensor of the second embodiment.

FIG. 4 is a schematic sectional view illustrating an acoustic sensor 61 according to a second embodiment of the present invention. The acoustic sensor 61 differs from the acoustic sensor 31 of the first embodiment in the structure of the element substrate 41. FIG. 5 is an exploded perspective view illustrating a structure of the element substrate 41 of the second embodiment.

In the first embodiment, one silicon substrate is etched into a concave shape to form the back chamber 45 whose lower surface is closed in the element substrate 41. On the other hand, in the second embodiment, a sub-substrate 41b is joined to a rear surface of a main substrate 41a to form the element substrate 41 as illustrated in FIG. 5. The main substrate 41a is formed by a silicon substrate or an SOI (Silicon On Insulator) substrate, and the back chamber 45 is formed in the main substrate 41a while the main substrate 41a is pierced from the surface to the rear surface. The surface of the sub-substrate 41b is flattened. The silicon substrate and the SOI substrate which are similar to those of the main substrate 41a or the glass substrate and the ceramic substrate such as Pyrex (registered trademark) and quartz which have linear expansion coefficients (about $2 \times 10^{-6}$ to about $10 \times 10^{-6}/^\circ$ C.) similar to those of the main substrate 41a are used as the sub-substrate 41b.

Any method, in which the joining material such as the bonding agent does not run up the back chamber 45 to reach the upper surface of the main substrate 41a, is used as the method for joining the main substrate 41a and the sub-substrate 41b. For example, joining surfaces of the main substrate 41a made of Si and the sub-substrate 41b made of Si are activated by a plasma treatment or the like, and the main substrate 41a and the sub-substrate 41b are joined at room temperature by applying a pressure while the joining surfaces are overlapped. In another method, the main substrate 41a and the sub-substrate 41b may be joined by heating and pressurization while a $SiO_2$ surface of the main substrate 41a made of the SOI and a $SiO_2$ surface of the sub-substrate 41b made of the SOI are overlapped. In still another method, the main substrate 41a made of Si and the sub-substrate 41b made of glass are overlapped, and a voltage may be applied to perform anodic bonding while the substrates 41a and 41b are heated and pressurized. In yet another method, metallic thin films made of Au or the like are deposited on the joining surfaces of the main substrate 41a made of Si and the joining surface of the sub-substrate 41b made of Si, the joining surfaces of the substrates 41a and 41b may be joined by the heating and pressurization while overlapped. In yet another method, after a hydrophilic treatment is performed to the joining surface (Al surface) of the sub-substrate 41b made of Al (or the sub-substrate 41b made of the Si substrate in which an Al thin film is formed in the joining surface), the sub-substrate 41b and the main substrate 41a made of Si are heated while overlapped, and the substrates 41a and 41b may be joined using hydrogen bonding. In yet another method, the main substrate 41a and sub-substrate 41b may be joined using the bonding agent made of an epoxy resin or an acrylic resin or a rubber agent which hardly oozes or runs up during the bonding.

When the main substrate 41a and the sub-substrate 41b are joined by the methods, the joining material such as the bonding agent does not runs up the wall surface of the back chamber 45 to reach the upper surface of the main substrate 41a. The process of producing the element substrate 41 becomes simplified, when the main substrate 41a that is pierced by the back chamber 45 is joined to the sub-substrate 41b to prepare the element substrate 41. That is, in the structure of the first embodiment, in order to form the back chamber 45 by the etching, it is necessary to carefully perform a time management of an etching depth such that the etching does not reach a bottom surface of the back chamber 45. On the other hand, in the second embodiment, the etching work of the back chamber 45 is facilitated because the main substrate 41a is simply pierced by the back chamber 45, and the depth of the back chamber 45 can accurately be controlled because the depth of the back chamber 45 depends on the thickness of the main substrate 41a.

Figure 6A:
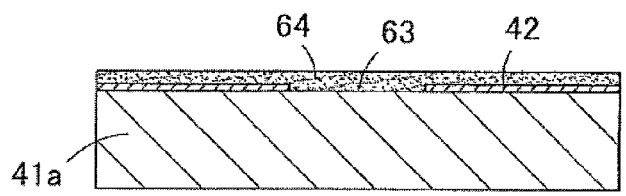
FIGS. 6A to 6F are schematic views illustrating a process of producing the acoustic sensing element according to the second embodiment.
Figure 6B:
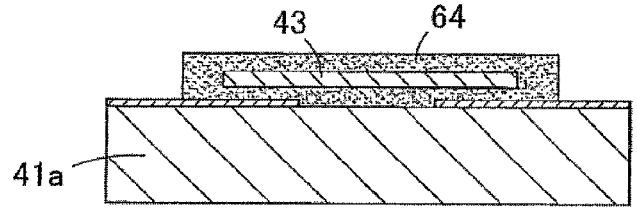
Figure 6C:
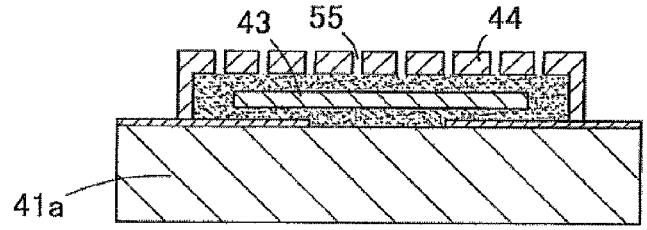

The process of producing an acoustic sensing element 62 will be described below. FIGS. 6A to 6F illustrate an example of a process of producing the acoustic sensing element 62. In producing the acoustic sensing element 62, the insulating film 42 ($SiO_2$ film) is deposited on the upper surface of the main substrate 41a (Si wafer) by a thermal oxidation method or the like, an opening 63 is formed while aligned with the back chamber opening position as illustrated in FIG. 6A, and a sacrifice layer 64 is stacked thereon. As illustrated in FIG. 6B, a polysilicon thin film is deposited on the sacrifice layer 64, the polysilicon thin film is formed into a predetermined shape to form the vibration electrode plate 43, the sacrifice layer 64 is stacked on the vibration electrode plate 43 again, and the sacrifice layer 64 is formed into a space shape in the fixed electrode plate 44. Then, the fixed electrode plate 44 (the back plate 50 and the fixed electrode 51) are formed on the sacrifice layer 64 and the insulating film 42 to make the acoustic holes 55 in the fixed electrode plate 44. FIG. 6C illustrates this state.

Figure 6D:
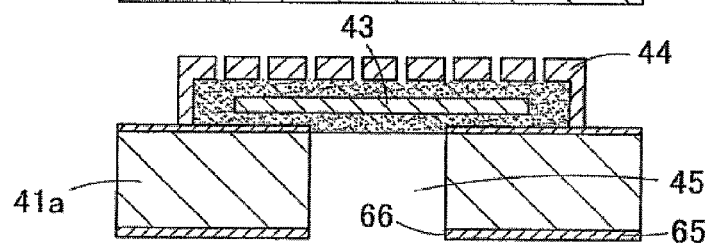

When the vibration electrode plate 43, the sacrifice layer 64, and the fixed electrode plate 44 are formed on the main substrate 41a, as illustrated in FIG. 6D, an etching mask 65 made of $SiO_2$ or SiN is deposited on the lower surface of the main substrate 41a, and an etching window 66 is opened in the etching mask 65. The main substrate 41a is anisotropically etched from the lower surface through the etching window 66 by wet etching or dry etching, and the etching is stopped when the etching reaches the upper surface of the main substrate 41a, whereby the back chamber 45 vertically pierces the main substrate 41a.

Figure 6E:
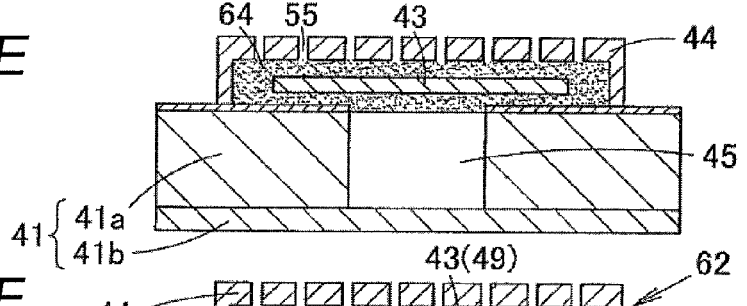
Figure 6F:
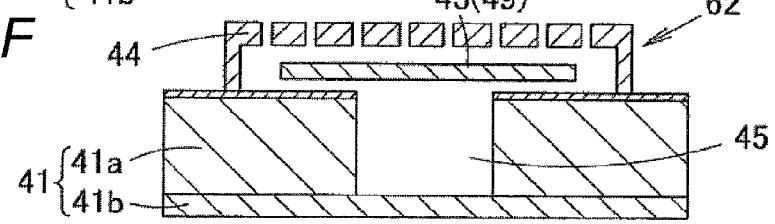

As illustrated in FIG. 6E, thereafter, the etching mask 65 of the lower surface is removed, the sub-substrate 41b (wafer) is joined to the lower surface of the main substrate 41a by the above-described methods to form the element substrate 41. Then, as illustrated in FIG. 6F, an etching solution is brought into contact with the sacrifice layer 64 through the acoustic holes 55 on the upper surface, and the sacrifice layer 64 in the fixed electrode plate 44 is removed by the etching, and the diaphragm 49 is floated from the upper surface of the main substrate 41a in the fixed electrode plate 44 to prepare the plurality of acoustic sensing elements 62 on one main substrate 41a (Si wafer). After the acoustic sensing elements 62 are washed, the element substrate 41 (two joined wafers) is diced to cut out the acoustic sensing elements 62, thereby obtaining the individual acoustic sensing element 62.

Figure 7A:
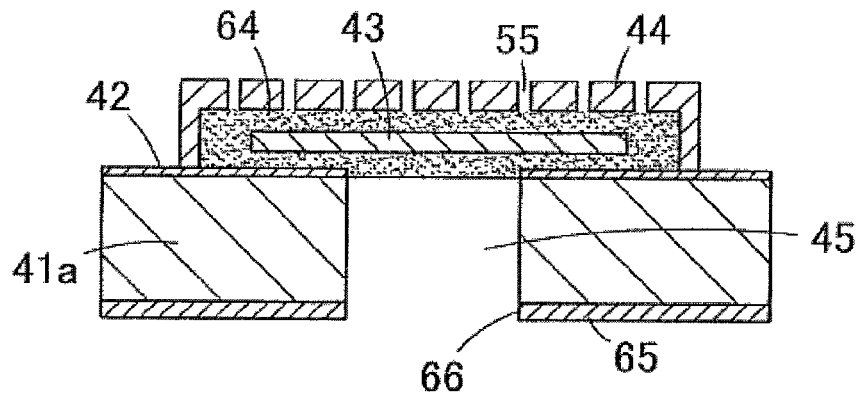
FIGS. 7A to 7C are schematic views illustrating a part of another process of producing the acoustic sensing element of the second embodiment.
Figure 7B:
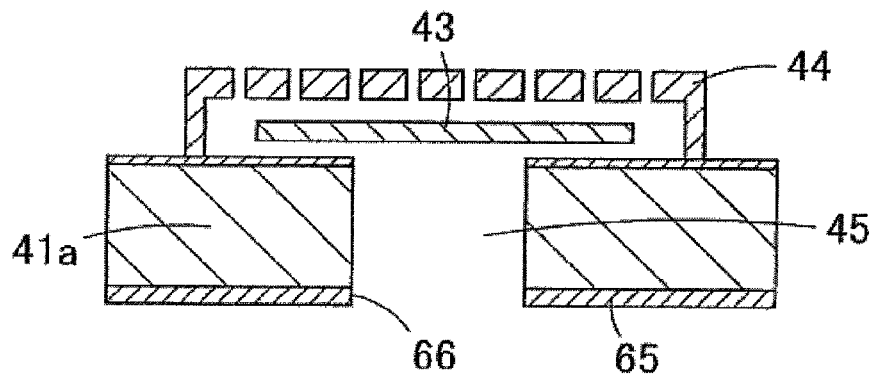
Figure 7C:
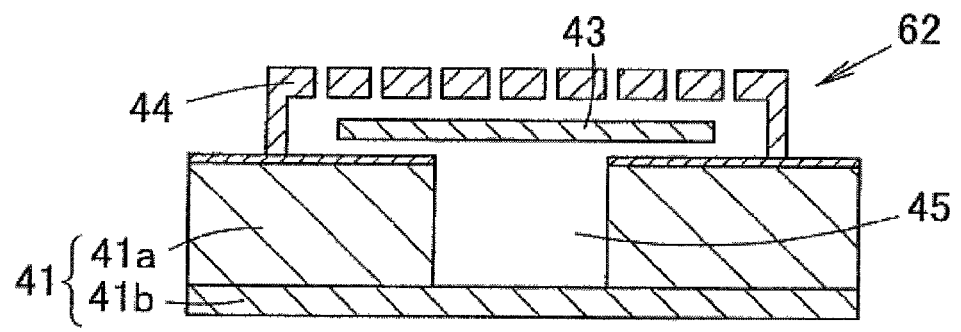

Alternatively, the acoustic sensing element 62 may be produced through a process illustrated in FIGS. 7A to 7C. FIG. 7A illustrates the same state as that of FIG. 6D, and the vibration electrode plate 43, the sacrifice layer 64, and the fixed electrode plate 44 are provided on the upper surface of the main substrate 41a to form the back chamber 45 in the main substrate 41a through the etching window 66 by the process illustrated in FIGS. 6A to 6D.

Then the etching solution is brought into contact with the sacrifice layer 64 through the acoustic holes 55 or the like on the upper surface, the sacrifice layer 64 in the fixed electrode plate 44 is removed by the etching as illustrated in FIG. 7B, the diaphragm 49 is floated from the upper surface of the main substrate 41a in the fixed electrode plate 44, and the plurality of acoustic sensing elements 62 are prepared on one main substrate 41a (Si wafer). As illustrated in FIG. 7C, the etching mask 65 of the lower surface is removed, and the sub-substrate 41b (wafer) is joined to the lower surface of the main substrate 41a by the above-described methods to form the element substrate 41. After the acoustic sensing elements 62 are washed, the element substrate 41 (two joined wafers) is diced to cut out the acoustic sensing elements 62, thereby obtaining the individual acoustic sensing element 62.

Modification of Second Embodiment

Figure 8:
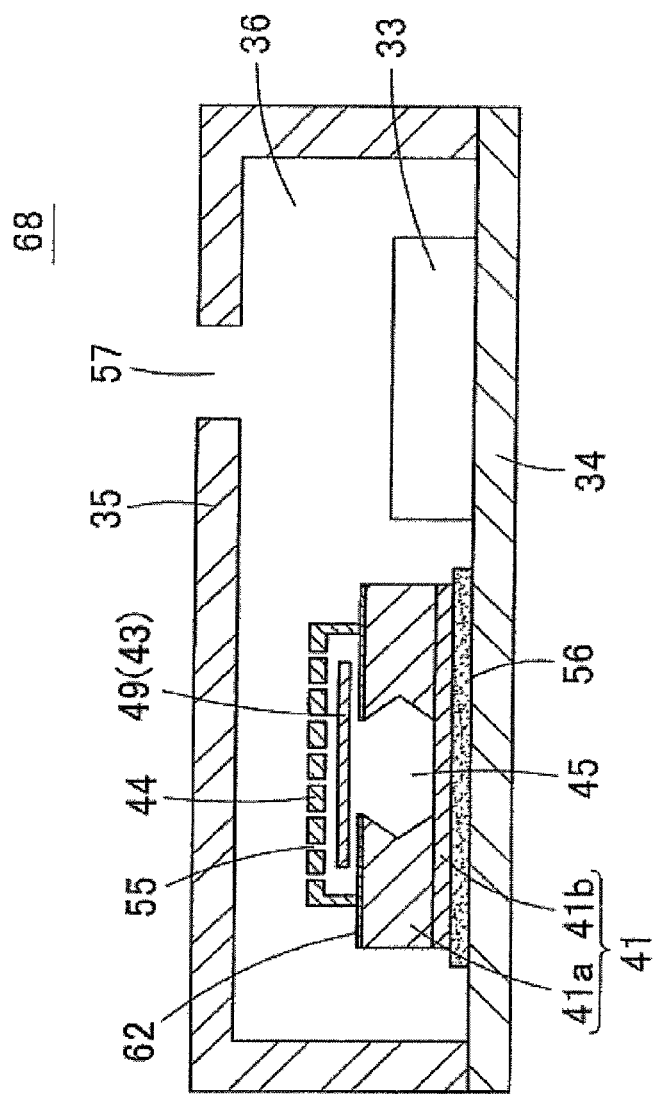
FIG. 8 is a schematic sectional view of an acoustic sensor according to a modification of the second embodiment.

The back chamber 45 provided in the main substrate 41a may be formed into any shape as long as the back chamber 45 can be prepared. For example, the back chamber 45, in which an upper half is formed into a truncated-pyramid shape that is narrowed upward while a lower half is formed into an inverted truncated-pyramid shape that is narrowed downward, is formed in an acoustic sensor 68 according to a modification of the second embodiment as illustrated in FIG. 8.

Third Embodiment

Figure 9:
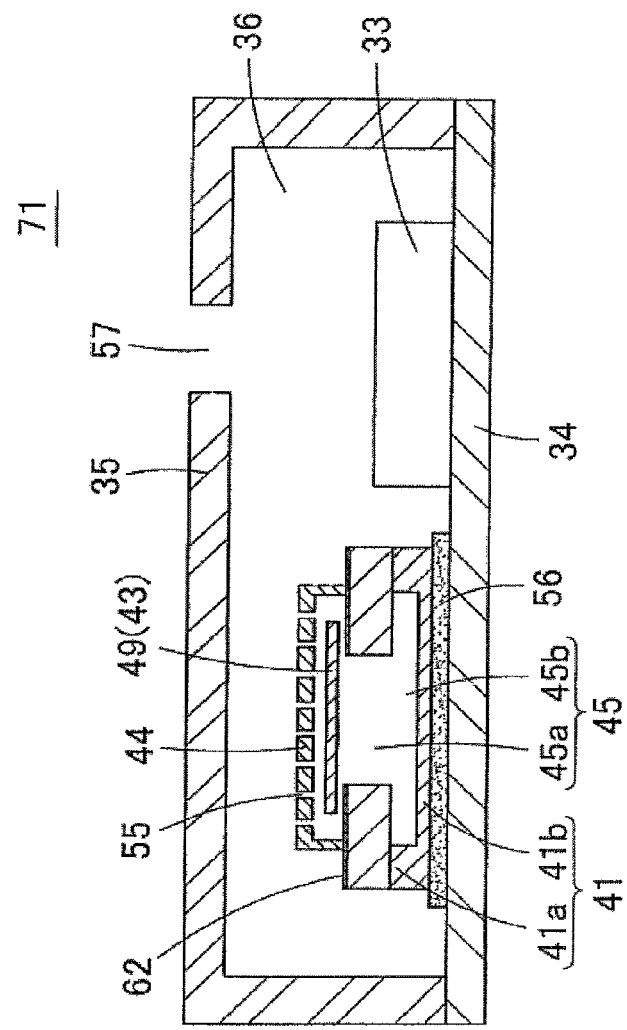
FIG. 9 is a schematic sectional view of an acoustic sensor according to a third embodiment of the present invention.
Figure 10:
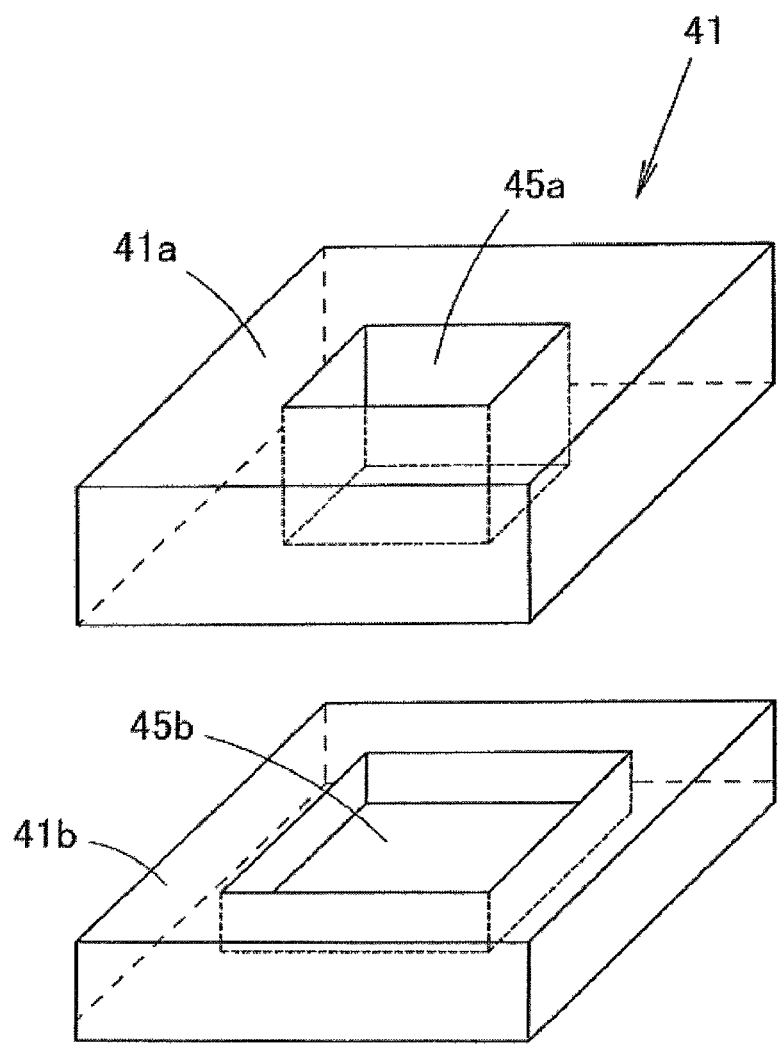
FIG. 10 is an exploded perspective view illustrating an element substrate of an acoustic sensing element used in the acoustic sensor of the third embodiment.

FIG. 9 is a schematic sectional view illustrating an acoustic sensor 71 according to a third embodiment of the present invention. The sub-substrate 41b having the flat surface joined to the lower surface of the main substrate 41a is used in the acoustic sensor 61 of the second embodiment. On the other hand, in the acoustic sensor 71 of the third embodiment, a recess 45b is also formed in the sub-substrate 41b as illustrated in FIG. 10. That is, in the element substrate 41 of the acoustic sensor 71, the sub-substrate 41b in which the recess 45b is formed in the upper surface is joined to the lower surface of the main substrate 41a having the through-hole 45a that pierces the main substrate from the surface to the rear surface, the element substrate 41 is formed by the main substrate 41a and the sub-substrate 41b, and the back chamber 45 is formed by the through-hole 45a and recess 45b, which are communicated with each other.

The acoustic sensing element 62 of the third embodiment can be produced similarly to the second embodiment, and the method similar to that of the second embodiment can be adopted in the method for joining the main substrate 41a and the sub-substrate 41b.

Figure 11:
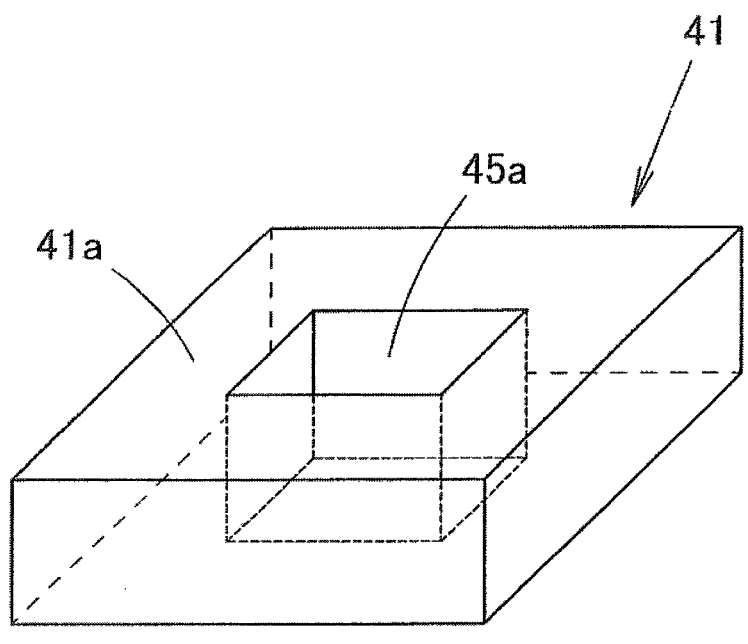
FIG. 11 is an exploded perspective view illustrating another shape of the element substrate of the acoustic sensing element of the third embodiment.
Figure 11:
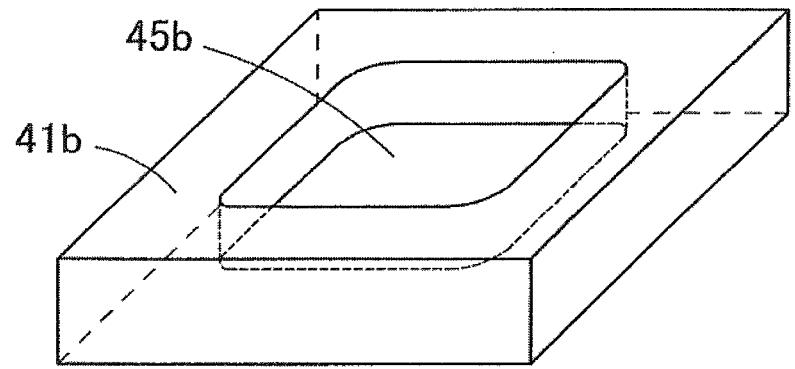

In the acoustic sensor 71, a volume of the back chamber 45 is further enlarged by providing the recess 45b in the sub-substrate 41b, so that sensitivity of the acoustic sensor 71 can be improved. The recess 45b may be formed into a shape in which each corner become angular as illustrated in FIG. 10, or may be formed into a shape in which each corner is rounded as illustrated in FIG. 11.

When a diameter of the upper surface opening of the recess 45b is larger than a diameter of the lower surface opening of the through-hole 45a, the recess 45b can be enlarged to increase the volume of the back chamber 45. Therefore, the sensitivity of the acoustic sensing element 32 can be improved.

Modification of Third Embodiment

Figure 12A:
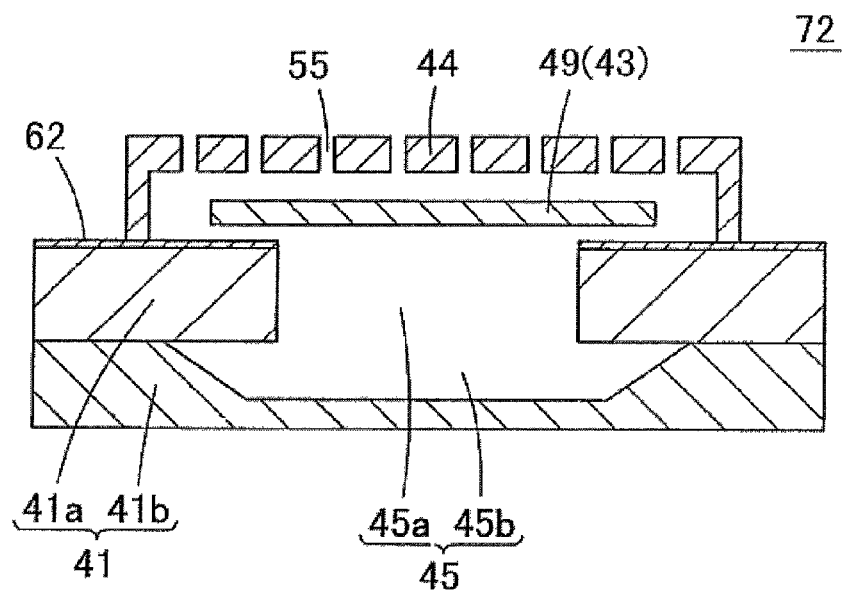
FIG. 12A is a schematic sectional view of an acoustic sensing element according to a modification of the third embodiment.
Figure 12B:
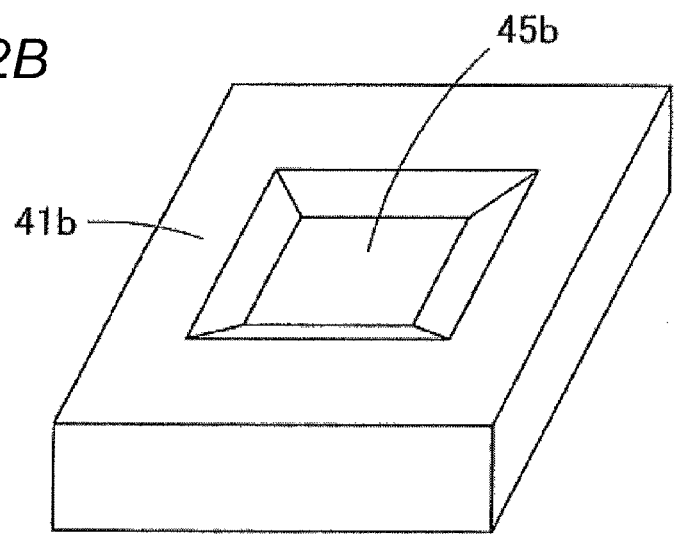
FIG. 12B is a perspective view illustrating a sub-substrate of the acoustic sensing element.
Figure 13A:
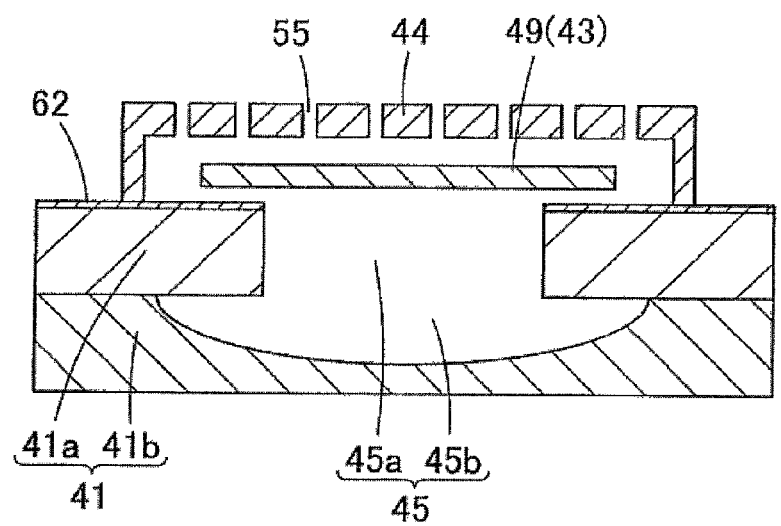
FIG. 13A is a schematic sectional view of an acoustic sensing element according to another modification of the third embodiment.
Figure 13B:
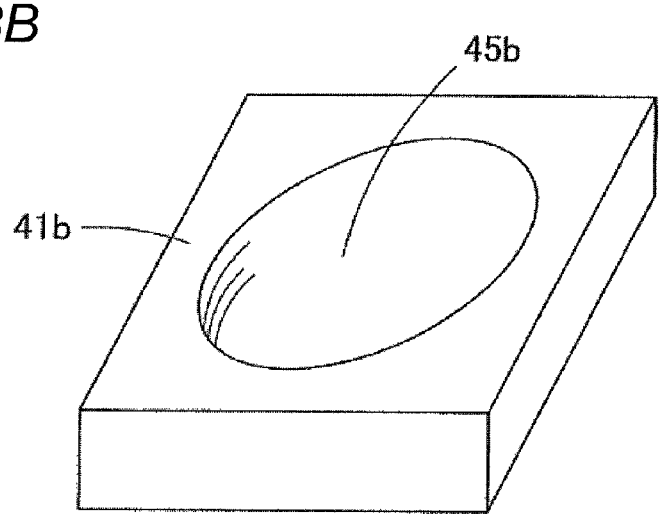
FIG. 13B is a perspective view illustrating a sub-substrate of the acoustic sensing element.

The through-hole 45a made in the main substrate 41a and the recess 45b provided in the sub-substrate 41b can be formed into various shapes in the third embodiment. For example, in an acoustic sensing element 72 illustrated in FIG. 12A, the recess 45b having the inverted truncated-pyramid shape illustrated in FIG. 12B is provided while communicated with the lower surface of the through-hole 45a having the prismatic shape. In an acoustic sensing element 73 illustrated in FIG. 13A, the recess 45b having the spherical shape illustrated in FIG. 13B is provided while communicated with the lower surface of the through-hole 45a having the prismatic shape.

Figure 14A:
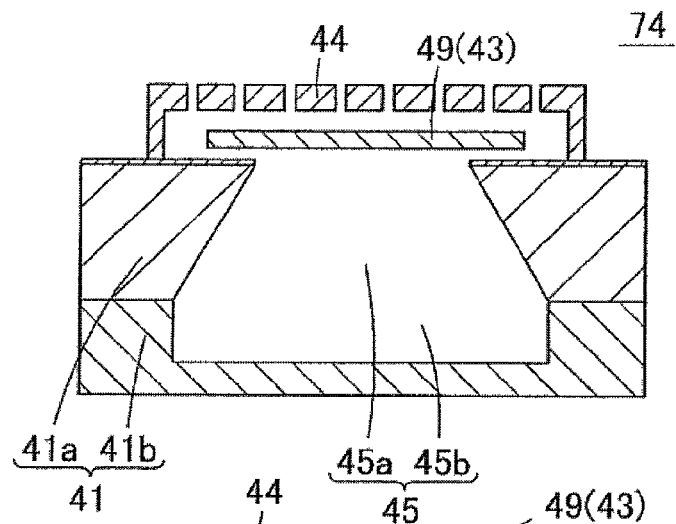
FIGS. 14A, 14B, and 14C are schematic sectional views of acoustic sensing elements according to still another modification of the third embodiment, respectively.
Figure 14B:
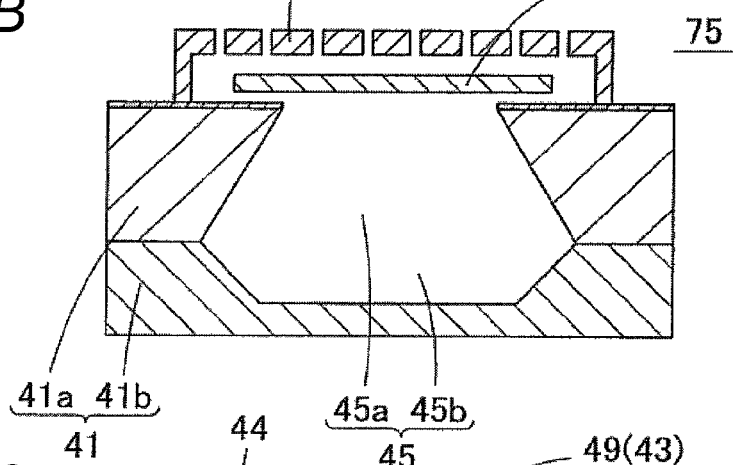
Figure 14C:
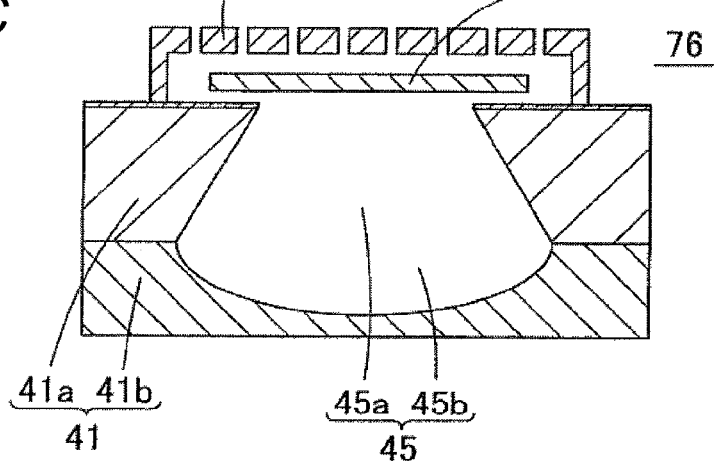
Figure 15A:
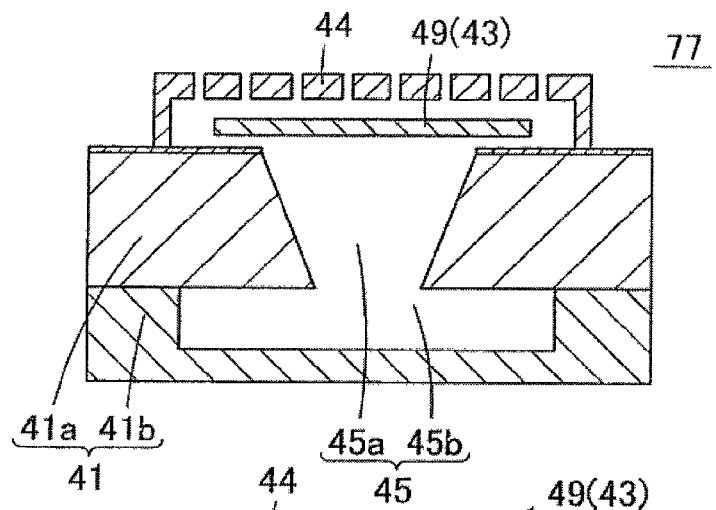
FIGS. 15A, 15B, and 15C are schematic sectional views of acoustic sensing elements according to yet another modification of the third embodiment, respectively.
Figure 15B:
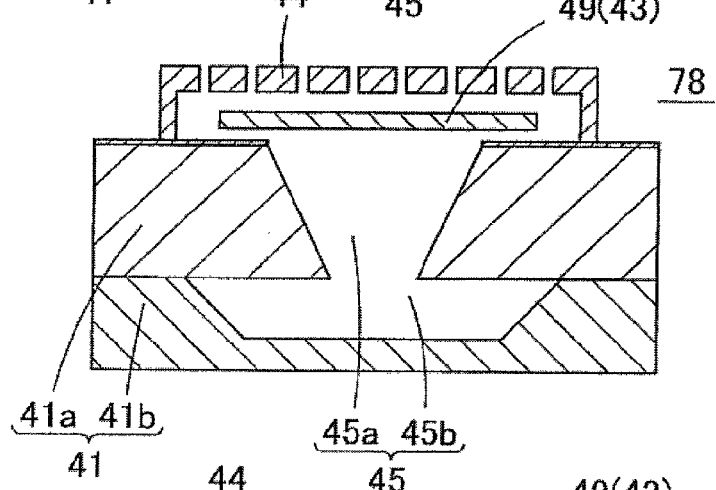
Figure 15C:
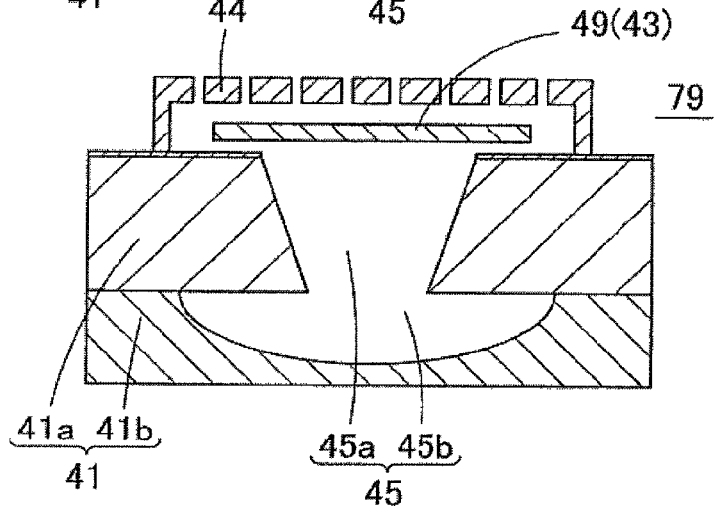
Figure 16A:
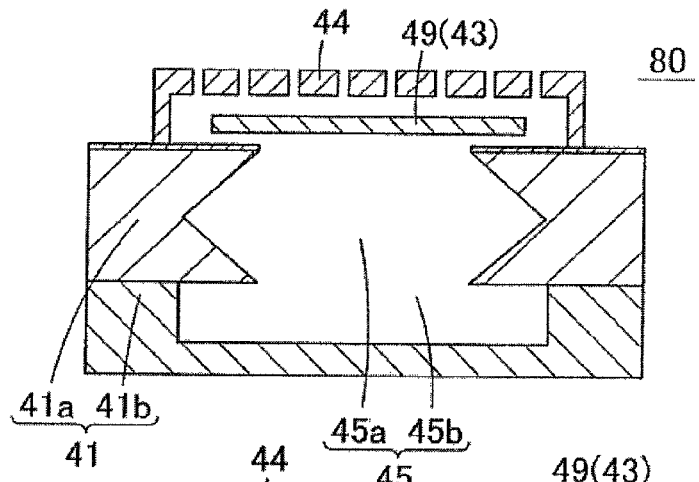
FIGS. 16A, 16B, and 16C are schematic sectional views of acoustic sensing elements according to yet another modification of the third embodiment, respectively.
Figure 16B:
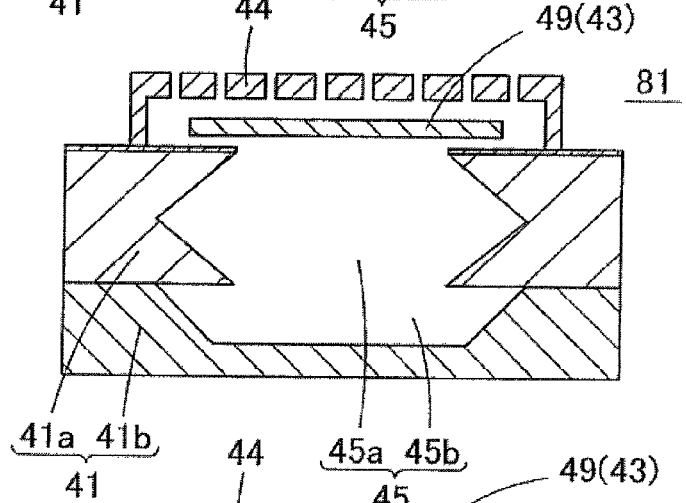
Figure 16C:
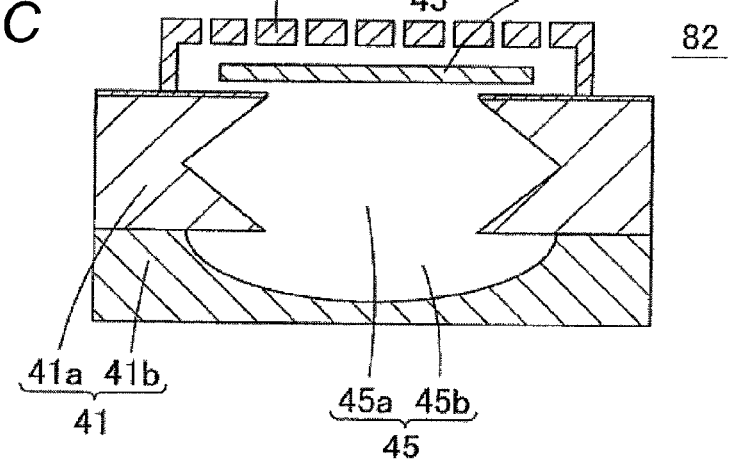

Various modifications except those of FIGS. 12 and 13 can be made. The recesses 45b having the rectangular, inverted truncated-pyramid, and spherical shapes are provided in acoustic sensing elements 74 to 76 illustrated in FIGS. 14A to 14C while communicated with the lower surface of the through-hole 45a having the truncated-pyramid shape that is narrowed upward, respectively. The recesses 45b having the rectangular, inverted truncated-pyramid, and spherical shapes are provided in acoustic sensing elements 77 to 79 illustrated in FIGS. 15A to 15C while communicated with the lower surface of the through-hole 45a having the truncated-pyramid shape that is broadened upward, respectively. The recesses 45b having the rectangular, inverted truncated-pyramid, and spherical shapes are provided in acoustic sensing elements 80 to 82 illustrated in FIGS. 16A to 16C while communicated with the lower surface of the through-hole 45a having the shape in which the upper half is formed into the truncated-pyramid shape narrowed upward while the lower half is formed into the inverted truncated-pyramid shape narrowed downward, respectively.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An acoustic sensing element comprising:
   a substrate that includes a back chamber;
   a vibration electrode plate that is provided on an upper side of the substrate while being opposite an upper surface opening of the back chamber; and
   a fixed electrode plate that is provided opposite the vibration electrode plate, an acoustic hole being made in the fixed electrode plate,
   wherein the acoustic sensing element outputs an electric signal based on an electrostatic capacitance change generated between the vibration electrode plate and the fixed electrode plate by a displacement of the vibration electrode plate,
   wherein the substrate is formed by joining a sub-substrate to a lower surface of a main substrate having a through-hole that pierces the main substrate from a front surface to a rear surface, and
   wherein a lower surface of the through-hole is closed by the sub-substrate, thereby forming the back chamber by a space including the through-hole, a lower surface of the back chamber being closed into a pouched shape.

2. The acoustic sensing element according to claim 1, wherein a recess is formed in the sub-substrate while communicated with the through-hole, and the back chamber is formed by the through-hole and the recess.

3. The acoustic sensing element according to claim 1, wherein the main substrate and the sub-substrate are joined by a method in which a bonding agent is not used.

4. The acoustic sensing element according to claim 1, wherein the main substrate and the sub-substrate are made of materials whose linear expansion coefficients are substantially equal to each other.

5. An acoustic sensor, wherein a lower surface of the acoustic sensing element according to claim 1 is stuck to an upper surface of a base substrate by a bonding agent, and a cover is attached to the upper surface of the base substrate such that the acoustic sensing element is covered therewith.

* * * * *